(12) United States Patent
Sato et al.

(10) Patent No.: US 7,733,611 B2
(45) Date of Patent: *Jun. 8, 2010

(54) MAGNETORESISTANCE EFFECT ELEMENT COMPRISING NANO-CONTACT PORTION NOT MORE THAN A MEAN FREE PATH AND MAGNETIC HEAD UTILIZING SAME

(75) Inventors: Isamu Sato, Tokyo (JP); Rachid Sbiaa, Tokyo (JP)

(73) Assignee: TDK Corporation, Tokyo (JP)

( * ) Notice: Subject to any disclaimer, the term of this patent is extended or adjusted under 35 U.S.C. 154(b) by 398 days.

This patent is subject to a terminal disclaimer.

(21) Appl. No.: 11/679,814

(22) Filed: Feb. 27, 2007

(65) Prior Publication Data

US 2008/0247097 A1  Oct. 9, 2008

Related U.S. Application Data

(63) Continuation of application No. 10/882,322, filed on Jul. 2, 2004, now Pat. No. 7,184,247.

(30) Foreign Application Priority Data

Sep. 30, 2003  (JP)  ............................ P2003-342456

(51) Int. Cl.
*G11B 5/39* (2006.01)
(52) U.S. Cl. .................................................. 360/324.1
(58) Field of Classification Search .............. 360/324.1, 360/324.11, 324.12, 324.2
See application file for complete search history.

(56) References Cited

U.S. PATENT DOCUMENTS 5,715,121 A   2/1998  Sakakima et al.
5,936,402 A   8/1999  Schep et al.
6,046,891 A   4/2000  Yoda et al.

(Continued)

FOREIGN PATENT DOCUMENTS

JP   11-510911   9/1999

(Continued)

OTHER PUBLICATIONS

N. Garcia et al., "Magnetorestistance in Excess of 200% In Ballistic Ni Nanocontacts at Room Temperature and 100 Oi", Physical Review Letters, Apr. 5, 1999, pp. 2923-2926, vol. 82, No. 14, © 1999 The American Physical Society.

(Continued)

*Primary Examiner*—Jefferson Evans
(74) *Attorney, Agent, or Firm*—Kenyon & Kenyon LLP

(57) ABSTRACT

A magnetoresistance effect element comprises a free layer composed of a ferromagnetic layer, a pinned layer composed of a ferromagnetic layer, and a layer disposed between the free layer and the pinned layer and including at least one nano-contact portion disposed at least one portion between the free layer and the pinned layer. The nano-contact portion has a dimension, including at least one of a length in the layer lamination direction and a length in a direction normal to the layer lamination direction, being not more than Fermi length. The nano-contact portion is provided, in an inside portion thereof, with a magnetic wall composed of either one of Bloch magnetic wall, Nëel magnetic wall or a combination wall thereof.

8 Claims, 2 Drawing Sheets

U.S. PATENT DOCUMENTS

| | | | |
|---|---|---|---|
| 6,052,262 | A | 4/2000 | Kamiguchi et al. |
| 6,077,618 | A | 6/2000 | Sakakima et al. |
| 6,452,764 | B1 | 9/2002 | Abraham et al. |
| 6,579,635 | B2 | 6/2003 | Krusin-Elbaum et al. |
| 6,590,750 | B2 | 7/2003 | Abraham et al. |
| 6,731,475 | B2 | 5/2004 | Ikeda |
| 6,804,090 | B2 | 10/2004 | Kokado |
| 6,833,278 | B2 | 12/2004 | Deak |
| 6,917,088 | B2 | 7/2005 | Takahashi et al. |
| 6,937,447 | B2 | 8/2005 | Okuno et al. |
| 7,035,062 | B1 | 4/2006 | Mao et al. |
| 2003/0104249 | A1 | 6/2003 | Okuno et al. |
| 2004/0201929 | A1 | 10/2004 | Hashimoto et al. |
| 2005/0068698 | A1 | 3/2005 | Sato et al. |
| 2005/0141147 | A1 | 6/2005 | Sbiaa et al. |
| 2005/0157433 | A1* | 7/2005 | Kamiguchi et al. ...... 360/324.1 |
| 2006/0192237 | A1* | 8/2006 | Huai .......................... 257/296 |
| 2007/0097555 | A1* | 5/2007 | Garcia ........................ 360/313 |

FOREIGN PATENT DOCUMENTS

JP    2003-204095    7/2003

OTHER PUBLICATIONS

N. Garcia et al., "Balistic Magnetoresistance In Nanocontacts Electrochemically Grown Between Macro-and Microscopic Ferromagnetic Electrodes", Applied Physics Letters, Mar. 11, 2002, pp. 1785-1787, vol. 80, No. 10, © 2002 American Institute of Physics.

* cited by examiner

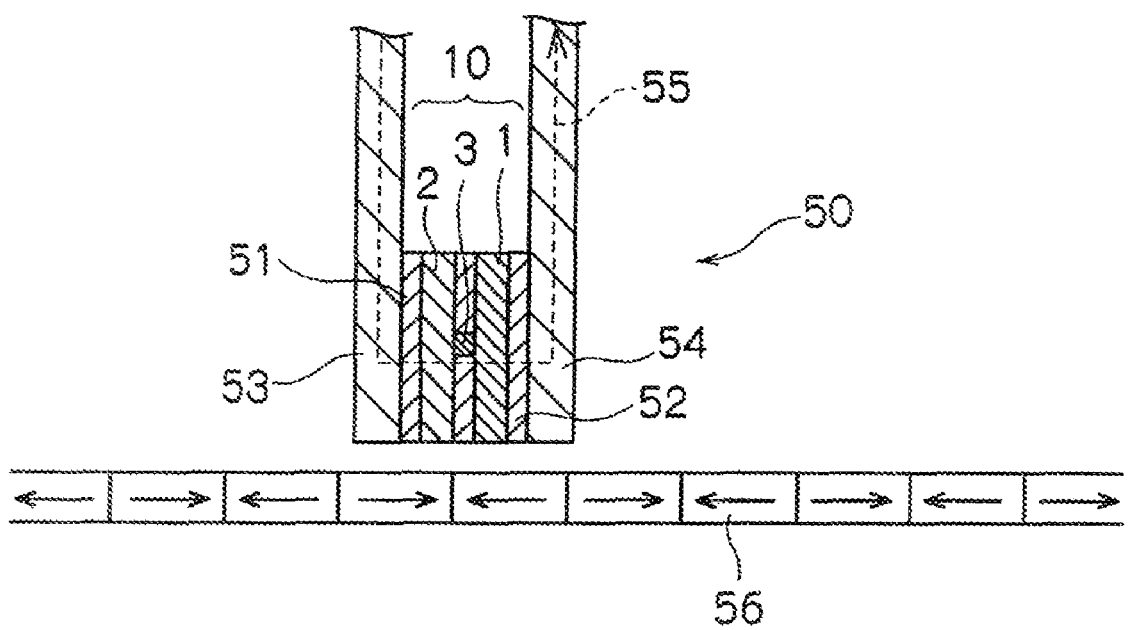

MAGNETORESISTANCE EFFECT ELEMENT COMPRISING NANO-CONTACT PORTION NOT MORE THAN A MEAN FREE PATH AND MAGNETIC HEAD UTILIZING SAME

BACKGROUND OF THE INVENTION

1. Field of the Invention

The present invention relates to a magnetoresistance effect element particularly provided with Ballistic Magneto Resistance (BMR) effect and also relates to a magnetic head provided with such magnetoresistance effect element.

2. Relevant Art

Generally, a giant magnetoresistance effect (GMR effect) is a phenomenon indicating rate of change in magnetoresistance (called herein magnetoresistance ratio) which is developed or reviled in a case that electric current passes in a plane of a lamination structure of ferromagnetic layer/non-magnetic layer/ferromagnetic layer. Moreover, the magnetoresistance effect element of such GMR has been further actively studied for the development of more large magneto-resistance ratio. Up to now, ferromagnetic tunnel junction and a CPP (Current Perpendicular to Plane)-type MR element, in which the current passes perpendicularly with respect to the lamination structure, have been developed, and hence, has high degree of expectation for reproducing (regenerative) element for magnetic sensor, magnetic recording element an the like.

In the field of the magnetic recording technology, according to the improvement of recording density, there is a continuous progress for making smaller recording bits, and as a result, it becomes difficult to obtain a sufficient signal strength. Thus, taking such matters into consideration, it has been desired for engineers in this field to search a material having high sensitive magnetoresistance effect and develop or revile an element indicating a large magnetoresistance ratio.

Recently, there has been reported, as material indicating magnetoresistance effect of more than 100%, "magnetic micro contact" which is formed by connecting two needle-like nickel (Ni) as shown, for example, in a document of "Physical Review Letters, vol. 82, p 2923 (1999), by N. Garcia, M. Munoz, and Y. W. Zhao" (Document 1). This magnetic micro contact is manufactured by butting two ferromagnetic materials worked in form of needle or in form of triangle. More recently, there has been development of a magnetic micro contact in which two fine Ni wires are arranged in T-shape and micro column is grown at a contact portion of these wires by electro-deposition method (for example, refer to a document of "Appl. Phys. Lett., Vol. 80, p 1785 (2002), by N. Garcia, G. G. Qian, and I. G. Sveliev" (Document 2).

It is considered that an extremely high MR (Magneto Resistance) ratio developing such element is based on spin transport of a magnetic area existing in the magnetic micro contact formed between two ferromagnetic layers having magnetized directions in anti-parallel to each other. It is considered that, in the magnetoresistance effect element utilizing the magnetic micro contact having such characteristics, since electrons pass without receiving any scattering or diffusion due to impurities (i.e., pass ballistically), such magnetoresistance effect element is called BMR element (Ballistic Magneto Resistance element).

In addition, more recently, a magnetoresistance effect element having such magnetic micro contact has been also reported. For example, in Japanese Patent Laid-open (KOKAI) Publication No. 2003-204095 (Document 3), there is reported a magnetoresistance effect element composed of first ferromagnetic layer/insulating layer/second ferromagnetic layer, in which the first ferromagnetic layer is connected to the second ferromagnetic layer at a predetermined portion of the insulating layer, the magnetoresistance effect element being provided with a hole having an opening with a diameter of less than 20 nm. Furthermore, in Japanese Patent National Publication (Laid-open) No. HEI 11-510911 (of PCT Appln.) (Document 4), there was reported a magnetoresistance effect element composed of two magnetic layers connected to each other through a narrow segment having a width of about 100 nm.

Still furthermore, in a prior art documents of "Phys. Review Letters, vol. 83, p 2030 (2003) by J. M. D Coey et al." (Document 5) and of "JETP Letters, vol. 75(10), 517(2002) by KA. A. Zvenzdin et al." (Document 6) disclose the research and studies about influence of the magnetic characteristics with respect to the stability of magnetic wall, which may constitute a problem at an application of the BMR element to the magnetic head.

However, in consideration of application of a BMR element to a magnetic head, a dimension of a free layer sensitive to magnetic field leaking from a surface of a medium is made small such as, for example, to several tens nm. For example, in a case of recording density of 1 Tbits/in$^2$, such dimension is of 40 to 50 nm, and in a case of a BMR element capable of realizing an extremely high MR ratio, a structure of a magnetic domain of the magnetic micro contact (called herein later "nano-contact portion") is a "key" of the BMR effect. As the miniaturization progresses, strong GEN magnetic field is generated from the end face of the thin free layer, and thermal stability is extremely lowered, thus providing inconvenience. Therefore, in the BMR element, it is an extremely important object to ensure the magnetic domain control and magnetic stability thereof.

SUMMARY OF THE INVENTION

An object of the present invention is to substantially eliminate defects or drawbacks encountered in the prior art mentioned above and to provide a magnetoresistance effect element, particularly for a magnetic head, having BMR effect capable of achieving improved stability and sensitivity of a free layer and a magnetic domain of a nano-contact portion constituting the magnetoresistance effect element.

Another object of the present invention is to also provide a magnetic head provided with such magnetoresistance effect element.

These and other objects can be achieved according to the present invention by providing, in one aspect, a magnetoresistance effect element comprising:

a free layer composed of a ferromagnetic layer;

a pinned layer composed of a ferromagnetic layer; and at least one nano-contact portion disposed at least one portion between the free layer and the pinned layer, wherein the nano-contact portion has a dimension, including at least one of a length in a layer lamination direction of the magnetoresistance effect element and a length in a direction normal to the layer lamination direction, being not more than Fermi length, and the nano-contact portion is provided, in an inside portion thereof, with a magnetic wall composed of either one of Bloch magnetic wall, Nëel magnetic wall and a combination wall thereof.

In a preferred embodiment of the above aspect, the magnetic wall formed inside the nano-contact portion may be the Bloch magnetic wall and a length of the nano-contact portion in a layer lamination direction and a lattice constant "a" of a material forming the nano-contact portion has a relationship "h<4×a".

The magnetic wall formed inside the nano-contact portion may be the Nëel magnetic wall and a distance "h" of the nano-contact portion in the lamination direction and a lattice constant "a" of a material forming the nano-contact portion has a relationship "h>20×a".

It is preferred that the ferromagnetic layers forming the free layer and pinned layer may be formed of a ferromagnetic material having a spin polarization of not less than 0.5.

The magnetoresistance effect element may further comprise an insulating layer, formed of an insulating material, between the free layer and the pinned layer, the insulating layer and the nano-contact portion forming an intermediate layer between the free layer and the pinned layer. The magnetoresistance effect element may also comprise a conductive layer disposed at least one of a portion between the free layer and the intermediate layer including the insulating layer and the nano-contact portion and a portion between the pinned layer and the intermediate layer. The conductive layer has a thickness of 0.1 to 1.0 nm.

The insulating layer is formed of an insulating material of oxide or nitride.

A sensing current passes between the free layer and the pinned layer through the nano-contact portion.

According to the magnetoresistance effect element of the structures and characters mentioned above, the nano-contact portion formed of the ferromagnetic material and disposed between the free layer and pinned layer both formed of the ferromagnetic material has a dimension, including at least one of a length in the layer lamination direction and a length in a direction normal to the layer lamination direction, being not more than Fermi length, so that the obtained magnetoresistance effect element can detect a signal with high sensitivity due to the BMR effect caused by the location of such nano-contact portion. In addition, the nano-contact portion is provided, in an inside portion thereof, with a magnetic wall composed of either one of Bloch magnetic wall, Nëel magnetic wall or a combination wall thereof, thus providing the minimum magnetic wall energy condition, which can ensure a high magnetic stability.

Moreover, in the case where the Bloch magnetic wall or the Nëel magnetic wall each satisfies the relationships mentioned above between the dimension of the nano-contact portion and the lattice constant, the minimum magnetic wall energy condition can be realized, thus ensuring a high magnetic stability.

In another aspect of the present invention, the above objects can be achieved by providing a magnetic head comprising:

a magnetoresistance effect element having a lamination structure;

electrodes disposed on both sides of the lamination structure of the magnetoresistance effect element; and a pair of shield members disposed on outside surfaces of the electrodes, respectively, the magnetoresistance effect element comprising: a free layer composed of a ferromagnetic layer; a pinned layer composed of a ferromagnetic layer; and at least one nano-contact portion disposed at least one portion between the free layer and the pinned layer, wherein the nano-contact portion has a dimension, including at least one of a length in a layer lamination direction of the magnetoresistance effect element and a length in a direction normal to the layer lamination direction, being not more than Fermi length and the nano-contact portion is provided, in an inside portion thereof, with a magnetic wall composed of either one of Bloch magnetic wall, Nëel magnetic wall and a combination wall thereof.

According to this aspect, since the magnetoresistance effect element having high sensitivity and stability in the magnetic domain of the nano-contact portion and the free layer can be applied to the magnetic head, the magnetic head provides an improved stability in operation and function.

The nature and further characteristic features of the present invention will be made more clear from the following descriptions made with reference to the accompanying drawings.

BRIEF DESCRIPTION OF THE DRAWINGS

In the accompanying drawings:

FIG. 4 is an illustration of a magnetic head as a magnetic reproduction element utilizing the magnetoresistance effect element according to the embodiment of the present invention.

DESCRIPTION OF THE PREFERRED EMBODIMENTS

Preferred embodiments of a magnetoresistance effect element and a magnetic head utilizing the same according to the present invention will be described hereunder with reference to the accompanying drawings.

[Magnetoresistance Effect Element]

Figure 1:
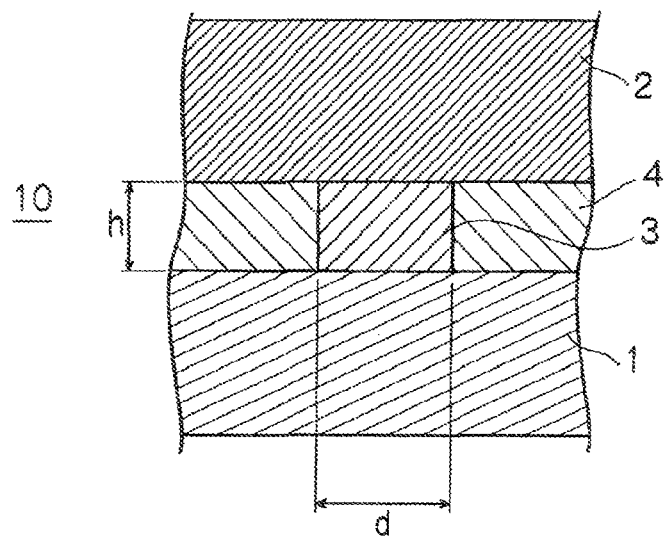
FIG. 1 is a sectional view, in a layer lamination direction, of a magnetoresistance effect element according to one embodiment of the present invention.

One embodiment of a magnetoresistance effect element is first described with reference to FIG. 1 showing the sectional view in its layer lamination direction.

Referring to FIG. 1, a magnetoresistance effect element 10 of the present invention is a BMR element comprising a free layer 1 composed of a ferromagnetic layer, a pinned layer 2 composed of a ferromagnetic layer and at least one (one or more than one) nano-contact portion portions 3, which is also composed of a ferromagnetic layer, disposed between the free layer 1 and the pinned layer 2. The nano-contact portion 3 has a vertical dimension or length, i.e., a length in the lamination direction, of not more than Fermi length. A magnetic wall appearing inside the nano-contact portion 3 constitutes Bloch magnetic wall or Nëel magnetic wall, or combination wall thereof.

Such magnetoresistance effect element 10 is usually formed on a substrate on which a buffer layer is formed. Further, in such making process, the magnetoresistance effect element will be classified into a top-type one in which the free layer 1 is formed on the side of the substrate or a bottom-type one in which the pinned layer 2 is, on the other hand, formed in the side of the substrate. Further, in usual, the term "top-type" means a structure in which the pinned layer is formed at an upper portion of the magnetoresistance effect element and, on the other hand, the term "bottom type" means a structure in which the pinned layer is formed at a lower portion of the magnetoresistance effect element.

[Nano-Contact Portion]

The nano-contact portion 3 of the magnetoresistance effect element 1 of this embodiment is disposed in an insulating layer 4 disposed between the free layer 1 and the pinned layer 2 in a manner that the nano-contact portion 3 is surrounded, at its periphery, by the insulating layer 4. In other words, the nano-contact portion 3 is disposed between the free layer 1 and the pinned layer 2, as ferromagnetic layers, together with the insulating layer 4.

In the above meaning, the magnetoresistance effect element 10 of this embodiment may be said that it comprises the free layer 1, the pinned layer 2 and an intermediate layer disposed therebetween and including one or more nano-contact portions 3 and the insulating layer 4.

The nano-contact portion 3 is formed of a ferromagnetic material having spin polarization of not less than 0.5, and as such ferromagnetic material, although various kinds of materials are utilized, the following ones will, for example, be listed up.

Ferromagnetic Metal Group: Co (spin polarization: 0.8); Fe (spin polarization: 0.5); Ni (spin polarization: 0.8); CoFe (spin polarization: 0.6 to 0.8); NiFe (spin polarization: 0.6 to 0.8); CoFeNi (spin polarization: 0.6 to 0.8).

Ferromagnetic Metalloid Group: $CrO_2$ (spin polarization: 0.9 to 1.0).

Ferromagnetic Oxide: $Fe_2O_4$ (spin polarization: 0.9 to 1.0); and so.

In the above ferromagnetic materials, the CoFe and NiFe may be more preferably utilized.

As mentioned above, in the embodiment of the present invention, the nano-contact portion 3 has the dimension of less than Fermi length, and as shown in FIG. 1, the dimension includes the length d in the width direction and the vertical length (height) h in the layer lamination direction normal to the width direction. In this meaning, the width length and the vertical length of the nano-contact portion 3 are both of not more than Fermi length.

The nano-contact portion 3 is constituted so as to have a shape of circle, elliptical, rectangular (triangle, square or so) or like supposing that the magnetoresistance effect element 10 be viewed in a plan view such as shown in FIG. 1. In this meaning, the above length d in the width direction of the nano-contact portion 3 will be considered to be equal to the maximum length in the plane in which the nano-contact portion 3 exists as viewed in the plan view of the magnetoresistance effect element 10 such as shown in FIG. 1, and also, in the front view thereof, the vertical length h of the nano-contact portion 3 in the layer lamination direction corresponds to the thickness thereof.

The Fermi length being of the width length d of the nano-contact portion 3 in its width direction is a value specific to material, which is different for each material constituting the ferromagnetic material forming the nano-contact portion 3. However, many kinds of such ferromagnetic materials have the Fermi length in a range of about 60 nm to 100 nm, so that the words "less than the Fermi length" will be prescribed as "less than 100 nm" or "less than 60 nm". In fact, Ni has the Fermi length of about 60 nm and that of Co is of about 100 nm.

Furthermore, it is more desirable that the length of the nano-contact portion 3 in its width direction is less than the mean free path. Although the value of this mean free path is also a value specific to ferromagnetic materials, and different from each other, constituting the nano-contact portions, many of them reside in a range of about 5 nm to 15 nm. Accordingly, in this meaning, the word "less than mean free path" will be prescribed substantially equivalently as "less than 15 nm" or "less than 5 nm". In concrete examples, NiFe has a mean free path of about 5 nm and that of Co is of about 12 nm.

Incidentally, it is also desirable that the vertical length (height in the lamination direction) h of the nano-contact portion 3 is of not more than the mean free path as the width direction thereof. More specifically, it is desired to be prescribed as being less than 100 nm or less than 60 nm, and moreover, it is further desirable for the length d to be prescribed to be less than the mean free path, i.e., less than 15 nm or less than 5 nm as mentioned above.

On the contrary, in a case that the length d in the width direction and the length h in the layer lamination direction of the nano-contact portion 3 exceed the Fermi length, the thickness of the magnetic wall of the nano-contact portion 3 becomes large in the case that the magnetization shows an anti-parallel state, and hence, it becomes difficult for electron passing the nano-contact portion 3 to keep their spin direction. As a result, in this meaning too, it is desirable for the preferred embodiment of the present invention that the dimension (d, h) of the nano-contact portion 3 is less than the Fermi length, and especially, in the viewpoint of well keeping the spin information, the dimension is less than the mean free path.

Further, on the other hand, in the case where the lengths d and h in the width and lamination directions of the nano-contact portion 3 are less than the Fermi length, a thin magnetic wall portion is generated to the magnetic wall section of the nano-contact portion 3. Accordingly, relative relationship in magnetization arrangement between the free layer 1 and the pinned layer 2, between which the nano-contact portion 3 is sandwiched, varies, and hence, electrical resistance between the free layer 1 and the pinned layer 2 will also vary. In the case of the magnetoresistance effect element 10 of the present invention described above, since, basically, there exists a magnetic field area, in which the electric resistance is reduced in accordance with the magnetic field even if magnetic field applied direction will be changed, it will be said that the magnetoresistance effect produced there is the effect which is produced by the magnetic wall formed within the nano-contact portion 3. Herein, the magnetic wall of the nano-contact portion 3 acts as a transition region or area of two portions (i.e., two ferromagnetic layers between which the nano-contact portion 3 is sandwiched) having different magnetized directions. Further, according to the present invention, the magnetoresistance effect more than 50% will be produced in accordance with the magnetized direction and magnitude of the applied magnetic field.

Such nano-contact portion 3 can be manufactured with high precision by using nano-lithography apparatus. Since the magnetoresistance effect element, of the present invention, provided with such nano-contact portion 3 indicates a large magnetoresistance ratio, it is considered that electrons can ballistically pass through the nano-contact portion 3 without any scattering. Further, the magnetoresistance ratio mentioned above, which is defined by the resistance R at a time of sufficiently large magnetic strength is applied and the resistance change $\Delta R$ which is the difference in resistance when pinned and free layers are parallel and anti-parallel.

A portion (or portions) other than the nano-contact portion 3 in the intermediate layer disposed between the free layer 1 and the pinned layer 2 formed of the ferromagnetic layers is composed of a non-magnetic layer 4, which is formed of, for example, an oxide such as aluminum oxide or silicon oxide or insulating material such as nitride of, for example, silicon nitride. The non-magnetic layer 4 has its length in the lamination direction substantially equal to the length h in the vertical direction of the nano-contact portion 3.

[Ferromagnetic Layers]

The ferromagnetic layers constituting the free layer 1 and the pinned layer 2 are connected via the intermediate layer including one or more nano-contact portions 3 disposed therebetween. Further, in the embodiment, it is to be noted that in a case where the free layer 1 and the pinned layer 2 both includes two or more ferromagnetic layers, the ferromagnetic layers disposed on the side of the nano-contact portion 3 are mentioned herein.

In the embodiment of the present invention, these ferromagnetic layers are formed of a ferromagnetic material having the spin polarization of not less than 0.5. For this purpose, although various ferromagnetic materials may be utilized, the same or identical material to that for the nano-contact portion 3 will be preferably utilized. That is, it is desirable to select the material from the following groups of ferromagnetic metal group: Co (spin polarization: 0.8); Fe (spin polarization: 0.5); Ni (spin-polarization: 0.8); CoFe (spin polarization: 0.6 to 0.8); NiFe (spin polarization: 0.6 to 0.8); CoFeNi (spin polarization: 0.6 to 0.8); Ferromagnetic Oxide: $Fe_3O_4$ (spin polarization: 0.9 to 1.0); and ferromagnetic metalloid group: $CrO_2$ (spin polarizability: 0.9 to 1.0) and so on, in which CoFe or NiFe will be selected as more preferable ferromagnetic material.

In the structure that the nano-contact portion 3 and the ferromagnetic sandwiching the nano-contact portion 3 are formed of the same ferromagnetic material, the film formation and etching processing can be made by using the same ferromagnetic material and, in addition, granular structural film formation technique can be preferably utilized, thus being advantageous and effective for the manufacturing of the magnetoresistance effect element 10 of the present invention.

Figure 3A:
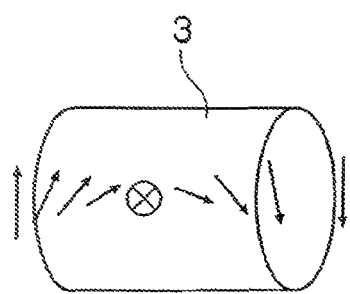
FIG. 3 (FIGS. 3A and 3B) are illustrations for explaining Bloch magnetic wall and Nëel magnetic wall.
Figure 3B:
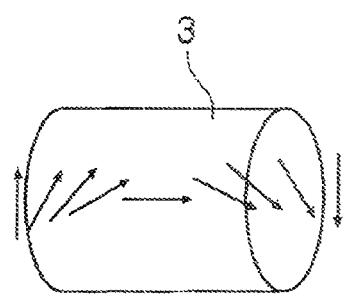

In the present invention, the magnetic wall appearing inside the nano-contact portion 3 of the structure mentioned above has a magnetic wall structure of Bloch wall structure such as shown in FIG. 3A, Néel wall structure such as shown in FIG. 3B or combination wall structure thereof. The magnetic wall structure is measured by a high sensitive MFM (Magnetic Force Microscope) or a TEM (Transmission-type Electron Microscope) and then evaluated.

In this measurement, (1) in a case of establishing a relationship of "h<4×a" between the length "h" in the layer lamination direction of the nano-contact portion 3 of the magnetoresistance effect element 10 of the present invention and a lattice constant "a" of the material forming the nano-contact portion 3, the Bloch magnetic wall mainly appears in the nano-contact portion 3, and on the contrary, in the case of "h≧4×a", the Bloch magnetic wall does not mainly appear and a vortex magnetic wall may mainly appear.

On the other hand, (2) in a case of establishing "h>20×a" therebetween, the Néel magnetic wall will mainly appear in the nano-contact portion 3, and on the contrary, in the case of "h≦20×a", the Néel magnetic wall does not mainly appear and the vortex magnetic wall may mainly appear.

Such magnetic wall structures appear in accordance with the dimension of the nano-contact portion 3 in the relationships mentioned above. In the case that the nano-contact portion 3 has either one of the magnetic wall structures of these Bloch wall structure, Néel wall structure or their combined wall structure, the magnetic wall exhibits the minimum energy state, thus ensuring a high magnetically stable condition.

[Free Layer]

The free layer 1 of the magnetoresistance effect element 10 of the present invention is a ferromagnetic layer, and the nano-contact portion 3 is sandwiched between this ferromagnetic layer and another ferromagnetic layer forming the pinned layer 2.

The free layer 1 is a layer in which its magnetization rotates in one or reverse direction in response to a magnetic field generated from a magnetization transition region (area) of a medium, and it is desired to setup the magnetization easy axis parallel to the medium surface.

Further, it is also desired that the ferromagnetic layer constituting the free layer 1 is formed of a material having the spin polarization of not less than 0.5, and more specifically, CoFe, Co or like material may be preferably utilized, such ferromagnetic layer being formed, in usual, by sputtering method or ion beam deposition method so as to provide a film having a thickness of 0.5 to 5 nm.

The free layer 1 may be formed of a single layer of ferromagnetic material as shown in FIG. 1 or two layers thereof.

In such case, when the free layer 1 is composed of two ferromagnetic layers, these ferromagnetic layers may be formed in ferromagnetic coupling state or anti-ferromagnetic coupling state.

In the former case of the ferromagnetic coupling state, one of the ferromagnetic layers disposed at a position apart from the position of the nano-contact portion 3 is composed of a material having a high spin polarization and, on the other hand, the other ferromagnetic layer disposed adjacent to the nano-contact portion 3 is composed of a soft magnetic material having a small magnetostriction. According to such combined arrangement of the ferromagnetic layers of different materials, high sensitivity and wide linear operation or function can be effectively ensured.

As a material having a high spin polarization, it may be possible to utilize various kinds of ferromagnetic materials having the spin polarization of not less than 0.5, and the material of CoFe or Co will be more preferably utilized to form it generally so as to have its thickness of about 0.5 to 5 nm by the sputtering method or ion beam deposition method. Further, as the soft material having the small magnetostriction, Ni or NiFe is specifically preferably utilized to form it generally so as to have its thickness of about 0.5 to 5 nm by the sputtering method or ion beam deposition method.

On the other hand, in the case of the anti-ferromagnetic coupled state, a non-magnetic layer is formed between these two ferromagnetic layers, and in this case, the non-magnetic layer is a layer to induce anti-ferromagnetic coupling between these two ferromagnetic layers. For this purpose, the non-magnetic layer is formed of a material selected from the group consisting of Ru, Rh, Ir, Cu, Ag or Au, or an alloy thereof by the sputtering method or ion beam deposition method so as to provide a film generally having a thickness of 0.3 to 3 nm.

[Pinned Layer]

The pinned layer 2 is called "pin layer (pinned layer)" and is provided with a ferromagnetic layer, and the nano-contact portion 3 is sandwiched between this ferromagnetic layer and that constituting the free layer 1.

The ferromagnetic layer constituting the pinned layer 2 may be formed of various kinds of ferromagnetic materials having the spin polarization of not less than 0.5, and CoFe, Co or like will be more preferably utilized so as to provide a film usually having a thickness of about 2 to 10 nm by the sputtering method or ion beam deposition method.

As shown in FIG. 1, the pinned layer 2 is formed of a single ferromagnetic layer and may be formed of two ferromagnetic layers as necessity demands.

In the case of the pinned layer 2 being formed of two ferromagnetic layers, it is desirable to have a non-magnetic layer between these ferromagnetic layers, and in the case of providing the non-magnetic layer between these two ferromagnetic layers, it is desirable that the non-magnetic layer is formed of a material selected from the group consisting of Ru, Rh, Ir, Cu, Ag or Au, or an alloy thereof by sputtering method or ion beam deposition method so as to provide a film generally having a thickness of 0.3 to 3 nm.

The two ferromagnetic layers may be formed of the same material or materials different from each other with same or different thickness.

These two ferromagnetic layers are separated by the non-magnetic layer so as to provide an arrangement in which the easy axes of the magnetization are antiparallel to each other. According to the function of this non-magnetic layer, the magnetization of these two ferromagnetic layers can be stabilized. As a result, since the magnetic field does not leak from the side end surface of the layer structure, the stability of the entire structure of the magnetoresistance effect element can be improved. Further, these ferromagnetic layers and non-magnetic layers are formed by sputtering or ion beam deposition method or treatment.

Figure 2:
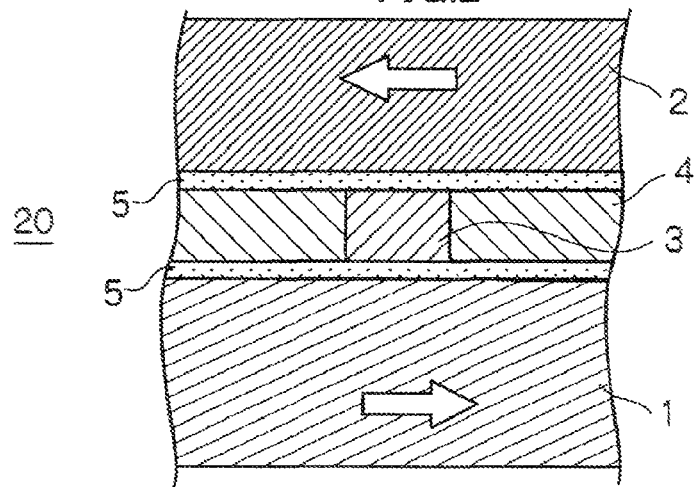
FIG. 2 is a sectional view, in a layer lamination direction, of a magnetoresistance effect element according to another embodiment of the present invention.

FIG. 2 represents another (second) embodiment of the magnetoresistance effect element according to the present invention, which is shown with a sectional view taken in the layer lamination (vertical) direction.

In this embodiment, conductive thin layer or layers are disposed in addition to the structure of the former embodiment of FIG. 1.

[Conductive Thin Layer]

A magnetoresistance effect element 20 of this embodiment comprises an insulating layer 4, as the intermediate layer, provided with the nano-contact portion 3, the free layer 1 disposed on one side of the insulating layer 4 and the pinned layer 2 disposed on the other side thereof, and further includes conductive thin layer or layers which are disposed between the insulating layer 4 and one or both of the free and pinned layers 1 and 2. In the illustration, two conductive thin layers 5 are disposed between the free layer 1 and the pinned layer 2, respectively.

It is desired to form the conductive thin layer 5 of a material selected from the group consisting of materials including Cu, Au, Cr and Ag, and more specifically of Cu or Au, through the sputtering method or ion beam deposition method so as to provide a film having a thickness of 0.1 to 1.0 nm.

The magnetoresistance effect elements of the present invention mentioned above is usually disposed on a substrate on which a buffer layer is formed. As such substrate, there may be provided a Si substrate, a Si oxide substrate, an AlTiC substrate or like. The buffer layer is disposed for the purpose of enhancing crystallization of the free layer 1 and/or the anti-ferromagnetic layer disposed on the buffer layer, and as such buffer layer, for example, there may be provided Ta layer, NiCr layer or Cu layer through the sputtering method or vacuum deposition method so as to provide, usually, a film thickness of 2 to 10 nm.

Furthermore, the magnetoresistance effect elements of the present invention may be further provided with a magnetic stability control layer for making stable the magnetic stability as occasion demands. This magnetic stability control layer is a layer acting to stabilize the magnetizing direction of the free layer 1, and it comprises a non-magnetic layer, a ferromagnetic layer and an anti-ferromagnetic layer which are arranged in this order on the free layer 1 in a direction apart from the nano-contact portion.

Furthermore, in the magnetoresistance effect element of the present invention, each of the ferromagnetic layers sandwiching the nano-contact portion 3 has a flat surface in form of layer to easily carry out the magnetic domain control, so that it is possible to properly arrange the distribution of the magnetization. Accordingly, it becomes possible to sharply maintain the magnetic wall width between the ferromagnetic layers opposing to each other through the fine nano-contact portion 3 to thereby obtain the large magnetoresistance ratio. However, it is not always necessary for these two ferromagnetic layers to provide a flat layer surface, and it may be possible to provide a slightly rough surface or curved surface.

Furthermore, the present invention may include embodiments in which one or plural nano-contact portions 3 are formed and arranged, and in the case where plural (more than one) nano-contact portions 3 are disposed between the free layer and the pinned layer, the MR value may be slightly reduced, but, in comparison with the arrangement of the single nano-contact portion 3, the scattering of the MR values in each element could be reduced, thus easily reproducing the stable MR characteristics.

[Magnetic Head]

A magnetic head (magneto-resistive head) formed by utilizing the magnetoresistance effect element of the present invention of the structures and characters mentioned above can provide a large reproduced sensitivity because, by utilizing such magnetoresistance effect element, the magnetoresistance ratio of more than 50% can be produced.

FIG. 4 is an illustrated example of an embodiment of the magnetic head utilizing the magnetoresistance effect element of the present invention as a magnetic reproducing element.

With reference to FIG. 4, the magnetic head 50 of this embodiment comprises: the magnetoresistance effect element 10 including the free layer 1, the pinned layer 2, the nano-contact portion 3 sandwiched between these layers 1 and 2, and electrodes 51 and 52 disposed outside the free layer 1 and the pinned layer 2, i.e., opposite to the nano-contact portion side; and shield members 53 and 54 both disposed further outside the electrodes 51 and 52. Reference numeral 55 shows a flow of a sensing current (sensing current path).

In the magnetic head 50, the magnetoresistance effect element 10 is disposed so that the film surface thereof has a vertical arrangement with respect to a recording medium 56. In the illustrated arrangement, the nano-contact portion 3 is arranged in a direction approaching the recording medium 56 from the center of the magnetoresistance effect element 10. A magnetic field of a signal from the recording medium 56 becomes large as shortening the distance from the recording medium 56, and accordingly, the magnetic head having the structure in which the nano-contact portion 3 is disposed to such position provides a large efficiency for detecting the magnetic field of the free layer 1 sensitive to the magnetization, thus being advantageous.

Furthermore, in the illustrated embodiment of FIG. 4, although a horizontal magnetized film is illustrated as the recording medium 56, it may be substituted with a vertically magnetized film which is called perpendicular recording media.

The magnetoresistance effect element 10 of the embodiment shown in FIG. 4 has a width of 20 to 100 nm, and the respective layers constituting this element 10 having a thickness in the range of 0.5 to 20 nm may be optionally selected in accordance with the recording density and the required sensitivity to be utilized. Furthermore, the one or more nano-contact portions may be formed so as to provide the thickness of 2 to 20 nm.

The magnetoresistance effect element of the characters mentioned above can provide the magnetoresistance effect of not less than 50% and can detect the recording media field with high sensitivity. Furthermore, as mentioned above, according to the magnetoresistance effect element mounted to the magnetic head of the present invention, the easy axis of the free layer arranged in opposition to the recording medium formed of the horizontal magnetic film provides a direction parallel to the magnetization direction of the recording medium, and the magnetization of the easy axis is rotated in sensitive response to the magnetic field generated from the magnetization transition region of the recording medium. As a result, the sensing current passing the nano-contact portion varies and the leaking field of the recording medium can be extremely sensitively read out.

It is to be noted that the present invention is not limited to the described embodiment and many other changes and modifications may be made without departing from the scopes of the appended claims.

What is claimed is:

1. A magnetoresistance effect element comprising:
   a free layer composed of a ferromagnetic layer;
   a pinned layer composed of a ferromagnetic layer;
   at least one nano-contact portion disposed between the free layer and the pinned layer,
   an insulating layer formed of an insulating material and disposed between the free layer and the pinned layer, said insulating layer and said nano-contact portion forming an intermediate layer between the free layer and the pinned layer; and
   a conductive layer disposed on at least one of a portion between the free layer and the intermediate layer including the insulating layer and the nano-contact portion and a portion between the pinned layer and the intermediate layer including the insulating layer and the nano-contact portion
   wherein said nano-contact portion has a dimension, including at least one of a length in the layer lamination direction of the magnetoresistance effect element and a length in a direction normal to the layer lamination direction, being not more than a mean free path, and said nano-contact portion is provided, in an inside portion thereof, with a magnetic wall composed of one of a Bloch magnetic wall, a Neel magnetic wall and a combination wall thereof.

2. A magnetoresistance effect element according to claim 1, wherein said magnetic wall formed inside the nano-contact portion is the Bloch magnetic wall and a length of the nano-contact portion in a layer lamination direction and a lattice constant "a" of a material forming the nano-contact portion has a relationship "h<4×a".

3. A magnetoresistance effect element according to claim 1, wherein said magnetic wall formed inside the nano-contact portion is the Neel magnetic wall and a distance "h" of the nano-contact portion in the lamination direction and a lattice constant "a" of a material forming the nano-contact portion has a relationship "h>20×a".

4. A magnetoresistance effect element according to claim 1, wherein said conductive layer has a thickness of 0.1 to 1.0 nm.

5. A magnetic head comprising:
   a magnetoresistance effect element having a lamination structure;
   electrodes disposed on both sides of the lamination structure of the magnetoresistance effect element;
   a pair of shield members disposed on outside surfaces of the electrodes, respectively, said magnetoresistance effect element comprising: a free layer composed of a ferromagnetic layer; a pinned layer composed of a ferromagnetic layer; and at least one nano-contact portion disposed between the free layer and the pinned layer,
   an insulating layer formed of an insulating material and disposed between the free layer and the pinned layer, said insulating layer and said the nano-contact portion forming an intermediate layer between the free layer and the pinned layer; and
   a conductive layer disposed at least one of a portion between the free layer and the intermediate layer including the insulating layer and the nano-contact portion and a portion between the pinned layer and the intermediate layer including the insulating layer and the nano-contact portion
   wherein said nano-contact portion has a dimension, including at least one of a length in a layer lamination direction of the magnetoresistance effect element and a length in a direction normal to the layer lamination direction, being not more than a mean free path and said nano-contact portion is provided, in an inside portion thereof, with—a magnetic wall composed of one of a Bloch magnetic wall, a Néel magnetic wall and a combination wall thereof.

6. A magnetic head according to claim 5, wherein said magnetic wall formed inside the nano-contact portion is the Bloch magnetic wall and a length of the nano-contact portion in a layer lamination direction and a lattice constant "a" of a material forming the nano-contact portion has a relationship "h<4×a".

7. A magnetic head according to claim 5, wherein said magnetic wall formed inside the nano-contact portion is the Néel magnetic wall and a distance "h" of the nano-contact portion in the lamination direction and a lattice constant "a" of a material forming the nano-contact portion has a relationship "h>20×a".

8. A magnetic head according to claim 5, wherein said conductive layer has a thickness of 0.1 and 1.0 nm.

* * * * *